United States Patent
Ebisuno et al.

(10) Patent No.: US 10,614,755 B2
(45) Date of Patent: Apr. 7, 2020

(54) ACTIVE MATRIX DISPLAY DEVICE FOR REDUCING UNBALANCED VOLTAGE DROP

(71) Applicant: JOLED INC., Tokyo (JP)

(72) Inventors: Kohei Ebisuno, Tokyo (JP); Masafumi Matsui, Tokyo (JP); Hitoshi Tsuge, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/492,417

(22) Filed: Apr. 20, 2017

(65) Prior Publication Data
US 2017/0309227 A1 Oct. 26, 2017

(30) Foreign Application Priority Data
Apr. 26, 2016 (JP) .................. 2016-088638

(51) Int. Cl.
| G09G 3/3233 | (2016.01) |
| G09G 3/3258 | (2016.01) |
| G09G 3/3291 | (2016.01) |
| H01L 27/32 | (2006.01) |

(52) U.S. Cl.
CPC ......... *G09G 3/3233* (2013.01); *G09G 3/3258* (2013.01); *G09G 3/3291* (2013.01); *H01L 27/3262* (2013.01); *H01L 27/3276* (2013.01); G09G 2300/0426 (2013.01); G09G 2310/0297 (2013.01); G09G 2320/0219 (2013.01)

(58) Field of Classification Search
CPC ......... G09G 2310/0235; G09G 3/3607; G09G 3/2003; G09G 3/3614
See application file for complete search history.

(56) References Cited

U.S. PATENT DOCUMENTS

| 6,512,504 B1 | 1/2003 | Yamauchi et al. |
| 2003/0132900 A1 | 7/2003 | Yamauchi et al. |
| 2005/0184936 A1 | 8/2005 | Yamauchi et al. |
| 2005/0264498 A1 | 12/2005 | Asano |
| 2008/0018566 A1 | 1/2008 | Yamauchi et al. |
| 2011/0032238 A1* | 2/2011 | Asano .................. G09G 3/3233 345/211 |
| 2011/0090209 A1 | 4/2011 | Yamauchi et al. |
| 2012/0154258 A1 | 6/2012 | Asano |
| 2013/0264950 A1 | 10/2013 | Asano |

(Continued)

FOREIGN PATENT DOCUMENTS

| JP | 2005-338591 | 12/2005 |
| JP | 2009-080491 | 4/2009 |
| JP | 2009-222779 | 10/2009 |

OTHER PUBLICATIONS

Official communication issued in Japanese family member Patent Appl. No. 2016-088638, dated Oct. 15, 2019.

*Primary Examiner* — Yuzhen Shen
(74) *Attorney, Agent, or Firm* — Greenblum & Bernstein, P.L.C.

(57) ABSTRACT

A display device includes a plurality of pixels arranged in rows and columns, a plurality of first power lines that extend in a pixel column direction and through which a power supply voltage is supplied to the pixels, and a plurality of second power lines that extend in the pixel column direction and through which an initialization voltage different from the power supply voltage is to the pixels. The number of first power lines is greater than the number of second power lines.

8 Claims, 9 Drawing Sheets

(56) References Cited

U.S. PATENT DOCUMENTS

| | | |
|---|---|---|
| 2014/0346487 A1 | 11/2014 | Asano |
| 2015/0129853 A1* | 5/2015 | Shin .................... H01L 27/3213 |
| | | 257/40 |
| 2015/0187822 A1 | 7/2015 | Yamauchi et al. |
| 2015/0228233 A1 | 8/2015 | Asano |
| 2016/0055810 A1 | 2/2016 | Asano |
| 2016/0197105 A1 | 7/2016 | Yamauchi et al. |
| 2016/0204165 A1* | 7/2016 | Yang .................... H01L 27/323 |
| | | 345/174 |
| 2017/0018227 A1 | 1/2017 | Asano |
| 2017/0193899 A1* | 7/2017 | Yoon .................... G09G 3/3233 |
| 2017/0309229 A1 | 10/2017 | Asano |
| 2018/0190195 A1 | 7/2018 | Asano |

* cited by examiner

ACTIVE MATRIX DISPLAY DEVICE FOR REDUCING UNBALANCED VOLTAGE DROP

CROSS REFERENCE TO RELATED APPLICATION

The present application is based on and claims priority of Japanese Patent Application No. 2016-88638 filed on Apr. 26, 2016. The entire disclosure of the above-identified application, including the specification, drawings and claims, is incorporated herein by reference in its entirety.

FIELD

The present disclosure relates to an active matrix display device.

BACKGROUND

Active matrix display devices (display panels) such as organic electroluminescent (EL) or organic light-emitting diode (OLED) display devices have a display area in which a plurality of pixels are arranged in rows and columns. Each pixel includes a drive circuit and a display element such as a liquid crystal element or an organic EL element, the drive circuit being constituted by, for example, a switching element, a driver element, and a capacitive element.

In the active matrix display devices, power lines are installed to supply power supply voltages to each pixel. The power lines may be each installed for each pixel row or each pixel column.

Patent Literature (PTL) 1 discloses an active matrix electronic device in which pixels that belong to adjacent pixel columns are laid out axisymmetrically, and the adjacent pixel columns share a power line (current supply line) through which current is supplied to the EL elements of the pixels.

Patent Literature (PTL) 2 discloses an active matrix electro-optical device in which pixels that belong to adjacent pixel columns are laid out axisymmetrically, and the adjacent pixel columns share a power line (initialization line) through which an initialization voltage is supplied to the driver elements and capacitive elements of the pixels.

These configurations can reduce the number of power lines and therefore can improve the efficiency of layout in the display area.

CITATION LIST

Patent Literature

[PTL 1] Japanese Unexamined Patent Application Publication 2009-80491
[PTL 2] Japanese Unexamined Patent Application Publication 2009-222779

SUMMARY

Technical Problem

The power lines through which power supply voltages are supplied to each pixel have resistance components. Thus, a voltage drop occurs across the power lines when current flows between power sources and each pixel. Depending on the installation layout of the power lines, the amount of voltage drop varies among pixels, and therefore, the display area may have unevenness in luminance. From this viewpoint, sharing power lines among pixel columns as in PTL 1 and PTL 2 may increase load on the power lines and increase the amount of voltage drop, although this will result in improvement in the efficiency of layout. The amount of voltage drop also varies with the types of power source. For example, even if the way of sharing power lines among pixel columns is the same between the current supply lines disclosed in PTL 1 and the initialization lines disclosed in PTL 2, the amount of voltage drop differs between the current supply lines and the initialization lines because a different amount of current flows through each power line.

That is, in active matrix display devices that install a plurality of types of power lines, the amounts of voltage drop caused by the layout of the power lines become unbalanced, and for example, the amount of voltage drop across the current supply lines may become extremely greater than the amount of voltage drop across the initialization lines. It is thus necessary to equalize the amounts of voltage drop among different types of power lines in order to reduce unevenness in the luminance of the display area caused by the voltage drops across the power lines.

The present disclosure has been made to solve the aforementioned problem, and it is an object of the present disclosure to provide an active matrix display device that reduces unbalanced amounts of voltage drop in the display area, which is caused by the layout of the power lines.

Solution to Problem

In order to achieve the stated object, an embodiment of the active matrix display device according to the present disclosure includes a plurality of pixels arranged in rows and columns, a plurality of first power lines that extend in a first direction and through which a first power supply voltage is supplied to the plurality of pixels, the first direction being either a pixel row direction or a pixel column direction, and a plurality of second power lines that extend in the first direction and through which a second power supply voltage different from the first power supply voltage is supplied to the plurality of pixels. The number of the plurality of first power lines is greater than the number of the plurality of second power lines.

Advantageous Effects

The active matrix display device according to the present disclosure can reduce unbalanced amounts of voltage drop in the display area, which is caused by the layout of the power lines, without decreasing the efficiency of layout. As a result, display quality is improved.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
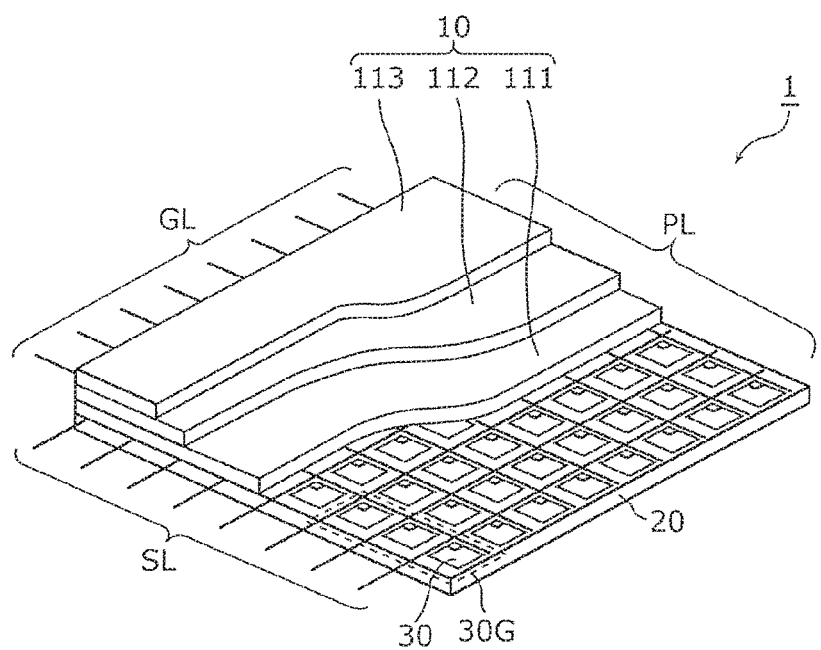
FIG. 1 is a partially cutaway perspective view of an active matrix display device according to an embodiment.

The following describes embodiments of the active matrix display device according to the present disclosure with reference to drawings. Each embodiment described below illustrates one specific example of the present disclosure. Thus, numerical values, constituent elements, arrangement positions and forms of connection of the constituent elements, and so on in the following embodiments are mere examples and do not intend to limit the scope of the present disclosure. Among the constituent elements described in the following embodiments, those that are not recited in any independent claim, which represents the broadest concept, are described as optional constituent elements.

Constituent elements that are substantially identical are given the same reference numerals or characters throughout the drawings. Each drawing is illustrated in schematic form, and the thicknesses of each film, the ratio of the sizes of each constituent element, and so on are not strictly proportional to actual values. In the following embodiments and drawings, a row direction and a column direction are directions that are set for purposes of illustration, and may be arbitrarily set to any two different directions. While the following description takes the example of the case where the row direction and the column direction are orthogonal to each other, there is not particular need for these directions to be orthogonal to each other.

Embodiment 1

First, a display device 1 according to the present disclosure will be described with reference to FIGS. 1 to 4B. The display device according to the present embodiment is an active matrix organic electroluminescent (EL) display device (organic EL display panel) and has a display area (pixel part) in which a plurality of pixels are arranged in row and column directions in a matrix.

1-1. Overall Configuration

A configuration of the display device 1 according to the present embodiment will be described with reference to FIG. 1. FIG. 1 is a partially cutaway perspective view of the display device 1 according to the present embodiment.

As illustrated in FIG. 1, the display device 1 is an active matrix display device that includes an organic EL element (organic light emitting element) 10 and an active matrix substrate 20 and in which a plurality of pixels 30 are arranged in a matrix.

The organic EL element 10 is a light emitting element that includes an anode metal (AM) layer 111 including an anode, an organic EL layer 112 including a light emitting layer, and a transparent electrode layer 113 including a cathode. The AM layer 111, the organic EL layer 112, and the transparent electrode layer 113 are stacked on the active matrix substrate 20 in the stated order.

While the description of the present embodiment takes the example of the case where the upper side of the display device 1 is the light emission side, the upper side of the display device 1 may not be the light emission side in actual usage. Thus, in actual usage, the light emission side is not limited to the upper side of the display device 1.

The active matrix substrate 20 is a substrate that includes a plurality of gate lines GL that extend in a row direction of the pixels 30, a plurality of source lines SL (data lines) that extend in a column direction of the pixels 30, and a plurality of power lines PL that extend in the column direction of the pixels 30. The active matrix substrate 20 is, for example, a thin-film semiconductor array device for display devices. The source lines SL and the gate lines GL are installed orthogonal to each other. Note that a plurality of power lines PL may further extend in the row direction of the pixels 30.

Each pixel 30 is partitioned by gate lines GL and source lines SL that are orthogonal to each other. Each pixel 30 includes a drive circuit that drives the organic EL element 10 of the pixel 30. In the present embodiment, each pixel 30 is a sub-pixel corresponding to one of the three primary colors R, G, and B, and three pixels 30 including a pixel 30 corresponding to blue (B), a pixel corresponding to red (R), and a pixel corresponding to green (G) constitute one pixel 30G. Note that pixels 30 of the same color are arranged adjacent to one another in the column direction. While, in FIG. 1, each pixel 30 refers to a drive circuit formed on the active matrix substrate 20, the pixel 30 is defined as including the aforementioned drive circuit and the organic EL element 10 formed on the drive circuit as described above.

Each of the gate lines GL is installed for each pixel row that is constituted by a plurality of pixels 30 in the same row. All pixels 30 that belong to a pixel row that corresponds to each gate line GL are connected to a control circuit (scanning-line drive circuit) by the gate line GL.

Each of the source lines SL is installed for each pixel column that is constituted by a plurality of pixels 30 in the same column. All pixels 30 that belong to a pixel column that corresponds to each source line SL are connected to a control circuit (signal-line drive circuit) by the source line SL.

The power lines PL extend in the pixel column direction (first direction) and, as will be described later, include first power lines through which a first power supply voltage is supplied to the pixels 30, and second power lines through which a second power supply voltage is supplied to the pixels 30.

In this way, the display device 1 according to the present embodiment adopts an active matrix method in which display of each individual pixel 30 is controlled.

1-2. Circuit Configuration of Pixel

Figure 2:
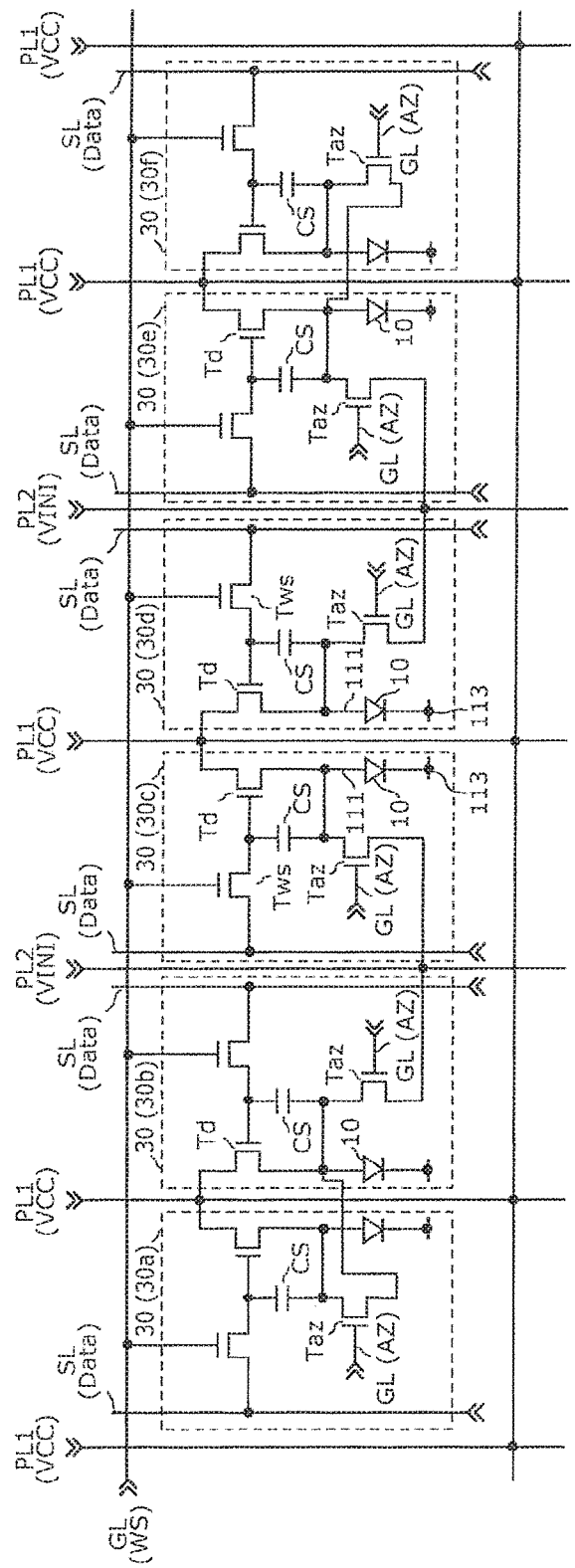
FIG. 2 illustrates an arrangement of a plurality of pixels and a circuit configuration of each pixel according to Embodiment 1.

Next, a circuit configuration of each pixel 30 will be described. FIG. 2 illustrates an arrangement and circuit configuration of a plurality of pixels 30 according to Embodiment 1. More specifically, FIG. 2 illustrates six pixels 30 arranged adjacent to one another in the row direction, as part of the display area.

As illustrated in FIG. 2, each pixel 30 in the display device 1 includes a driving transistor Td, transistors Tws and Taz, a capacitive element CS, and the organic EL element 10. Each pixel 30 is connected to a gate line GL, a source line SL, and a power line PL.

The driving transistor Td is a driver element that causes the organic EL element 10 to emit light by supplying a pixel current according to the voltage held by the capacitive element CS to the organic EL element 10. More specifically, one (first terminal) of the source and drain of the driving transistor Td is connected to a first power line PL1, and the other (second terminal) of the source and drain is connected to the anode (third terminal) of the organic EL element 10.

The transistor Tws is a switching transistor (first transistor) for writing a data voltage Vdata (light emission voltage) supplied through the source line SL to the capacitive element CS. More specifically, the transistor Tws switches between continuity and discontinuity between the source line SL and the first electrode of the capacitive element CS in accordance with a WS signal supplied through the gate line GL.

The capacitive element CS holds a voltage that corresponds to the data voltage Vdata supplied through the source line SL. In the present embodiment, the capacitive element CS holds a threshold voltage Vth of the driving transistor Td and further holds a voltage (Vdata+Vth) that is obtained by compensating for the threshold voltage Vth of the driving transistor Td with the data voltage Vdata supplied through the source line SL. More specifically, the capacitive element CS has a first electrode that is connected to the gate of the driving transistor Td, and a second electrode that is connected to the other (second terminal) of the source and drain of the driving transistor Td.

The organic EL element 10 is a light emitting element that emits light in accordance with a pixel current supplied by the driving transistor Td. The organic EL element 10 is constituted by the anode (third terminal) formed of the AM layer 111, a cathode (fourth terminal) formed of the transparent electrode layer 113, and an organic EL layer 112 sandwiched between the AM layer 111 and the transparent electrode layer 113. More specifically, the anode (third terminal) of the organic EL element 10 is connected to the other (second terminal) of the source and drain of the driving transistor Td.

The transistor Taz is a switching transistor (second transistor) for initializing (automatically zeroing) the voltage of the capacitive element CS. Here, the connection structure of the transistor Taz differs between the pixels 30*b*, 30*c*, 30*d*, and 30*e* and the pixels 30*a* and 30*f*.

The transistors Taz of the pixels 30*b* to 30*e* switch between continuity and discontinuity between the second power line PL2 through which the second power supply voltage (initialization voltage VINI) is supplied and the second electrode of the capacitive element CS in accordance with an AZ signal supplied through the gate line GL. That is, the transistors Taz of the pixels 30*b* to 30*e* each have one of the source and drain connected to the second power line PL2, and the other of the source and drain connected to the second electrode of the capacitive element CS.

On the other hand, the transistor Taz of the pixel 30*a* switches between continuity and discontinuity between the second electrode of the pixel 30*a* and the second electrode of the pixel 30*b* in accordance with the AZ signal supplied through the gate line GL. That is, the transistor Taz of the pixel 30*a* has one of the source and drain connected to the second electrode of the pixel 30*a*, and the other of the source and drain connected to the second electrode of the pixel 30*b*. The transistor Taz of the pixel 30*f* switches between continuity and discontinuity between the second electrode of the pixel 30*f* and the second electrode of the pixel 30*e* in accordance with the AZ signal supplied through the gate line GL. That is, the transistor Taz of the pixel 30*f* has one of the source and drain connected to the second electrode of the pixel 30*f*, and the other of the source and drain connected to the second electrode of the pixel 30*e*.

In the present embodiment, the driving transistors Td and the transistors Tws and Taz are n-channel type TFTs.

The gate lines GL are used to supply timing signals (gate voltages) such as the WS signal and the AZ signal to the pixels 30. In the present embodiment, the timing signals are supplied to each pixel 30 included in the same pixel row.

The source lines SL are data lines that are used to supply a light emission voltage to the pixels 30. In the present embodiment, the data voltage Vdata corresponding to gradation is supplied to each pixel 30 included in the same pixel column.

The first power lines PL1 are power lines extending in the pixel column direction (first direction) and used to supply a first power supply voltage (power supply voltage VCC) to the pixels 30*a* to 30*f*. The second power lines PL2 are power lines extending in the pixel column direction (first direction) and used to supply a second power supply voltage (initialization voltage VINI) different from the first power supply voltage to the pixels 30*b*, 30*c*, 30*d*, and 30*e*. In the present embodiment, all of the pixels 30 arranged in the display device 1 are supplied with the power supply voltage VCC from the first power lines PL1. Pixels that belong to the pixel columns including the pixels 30*b* to 30*e* are supplied with the initialization voltage VINI from the second power lines PL2. On the other hand, pixels that belong to the pixel column including the pixel 30*a* are supplied with the initialization voltage VINI from pixels that belong to the pixel column including the pixel 30*b*, and pixels that belong to the pixel column including the pixel 30*f* are supplied with the initialization voltage VINI from pixels that belong to the pixel column including the pixel 30*e*.

In other words, the pixel 30*a* sandwiches the pixel 30*b* between itself and the second power line PL2 that is closest in the pixel row direction to the pixel 30*a*, and is supplied with the initialization voltage VINI from the pixel 30*b*. Also, the pixel 30*f* sandwiches the pixel 30*e* between itself and the second power line PL2 that is closest in the pixel row direction to the pixel 30*f*, and is supplied with the initialization voltage VINI from the pixel 30*e*. That is, one of the pixels 30 is sandwiched between another one of the pixels 30 and the second power line PL2 that is closest to the other one of the pixels 30 in the pixel row direction orthogonal to the pixel column direction, and the other one of the pixels 30 is supplied with the initialization voltage VINI from the one of the pixels 30.

In the pixels 30 configured as described above, when the transistor Taz transitions from the ON state to the OFF state upon receipt of the AZ signal, the capacitive element CS detects and holds the threshold voltage Vth of the driving transistor Td. Thereafter, when the transistor Tws turns on upon receipt of the WS signal and supplies the data voltage Vdata, the capacitive element CS holds the voltage (Vdata+Vth) obtained by compensating for the threshold voltage Vth. As a result, the driving transistor Td supplies a pixel current according to the data voltage Vdata, which does not depend on the threshold voltage Vth of the driving transistor Td, to the organic EL element 10. Accordingly, the organic EL element 10 can emit light at a luminance corresponding to the gradation indicated by the data voltage Vdata.

Here, the number of first power lines PL1 is greater than the number of second power lines PL2. In the present embodiment, three first power lines PL1 and two second power lines PL2 are installed for the six pixels 30*a* to 30*f* as illustrated in FIG. 2. In other words, the number of pixels 30 to which the power supply voltage VCC is supplied from a single first power line PL11 is less than the number of pixels 30 to which the initialization voltage VINI is supplied from a single second power line PL2. In the present embodiment, the number of pixels 30 to which the power supply voltage VCC is supplied from a single first power line PL1 is two per row as illustrated in FIG. 2. On the other hand, the number of pixels 30 to which the initialization voltage VINI is directly or indirectly supplied from a single second power lines PL2 is three per row. More specifically, the second power line PL2 on the left side in FIG. 2 is used to directly supply the initialization voltage VINI to the pixels 30b and 30c and indirectly supply the initialization voltage VINI to the pixel 30a. The second power line PL2 on the right side in FIG. 2 is used to directly supply the initialization voltage VINI to the pixels 30d and 30e and indirectly supply the initialization voltage VINI to the pixel 30f.

If, in an active matrix display device that installs a plurality of types of power lines in a display area where a plurality of pixels 30 are arranged, the number of first power lines PL1 is the same as the number of second power lines PL2 and the amount of power supplied from the first power lines PL1 to the pixels 30 is different from the amount of power supplied from the second power lines PL2 to the pixels 30, the amount of voltage drop across a single first power line PL1 becomes different from the amount of voltage drop across a single second power line PL2 in the display area, and accordingly, the amounts of voltage drop become unbalanced.

In contrast, in the display device 1 according to the present embodiment, the amount of voltage drop across a single first power line PL1 and the amount of voltage drop across a single second power line PL2 can be balanced by differentiating between the number of first power lines PL1 and the number of second power lines PL2, the first power lines and the second power lines having different amounts of power supplied to the pixels 30. In the case of the present embodiment, the first power lines PL1 are power lines for supplying current flowing to the organic EL elements 10, and the second power lines PL2 are power lines for applying the initialization voltage VINI to the second electrodes of the capacitive elements CS. Thus, the amount of power supplied from the first power lines PL1 to the pixels 30 is greater than the amount of power supplied from the second power lines PL2 to the pixels 30. Accordingly, if the number of first power lines PL1 is greater than the number of second power lines PL2, an unbalanced amount of voltage drop per power line can be reduced without making considerable changes to the layout of the pixel circuit. It is thus possible to equalize the amounts of voltage drop at the pixels 30 without decreasing the efficiency of layout of the pixel circuit.

According to the present embodiment, in two pixels (e.g., pixels 30c and 30d) that share one first power line PL1 among the pixels 30, the constituent elements of the pixel circuits, namely, the organic EL elements 10, the driving transistors Td, the capacitive elements CS, and the transistors Tws and Taz, are arranged axisymmetrically with respect to the first power line PL1. In this case, the two pixels, which are arranged axisymmetrically with respect to the first power line PL1, can have the same form of connection with the first power line PL1. Accordingly, the amounts of voltage drop of the power supply voltage VCC supplied to the above two pixels can be equalized, and therefore, the amounts of voltage drop across the first power lines can be equalized.

1-3. Configuration of Wiring of Pixel

Next, a configuration of wiring of the pixels 30 in the display device 1 according to the present embodiment will be described with reference to FIGS. 3 to 4B.

Figure 3:
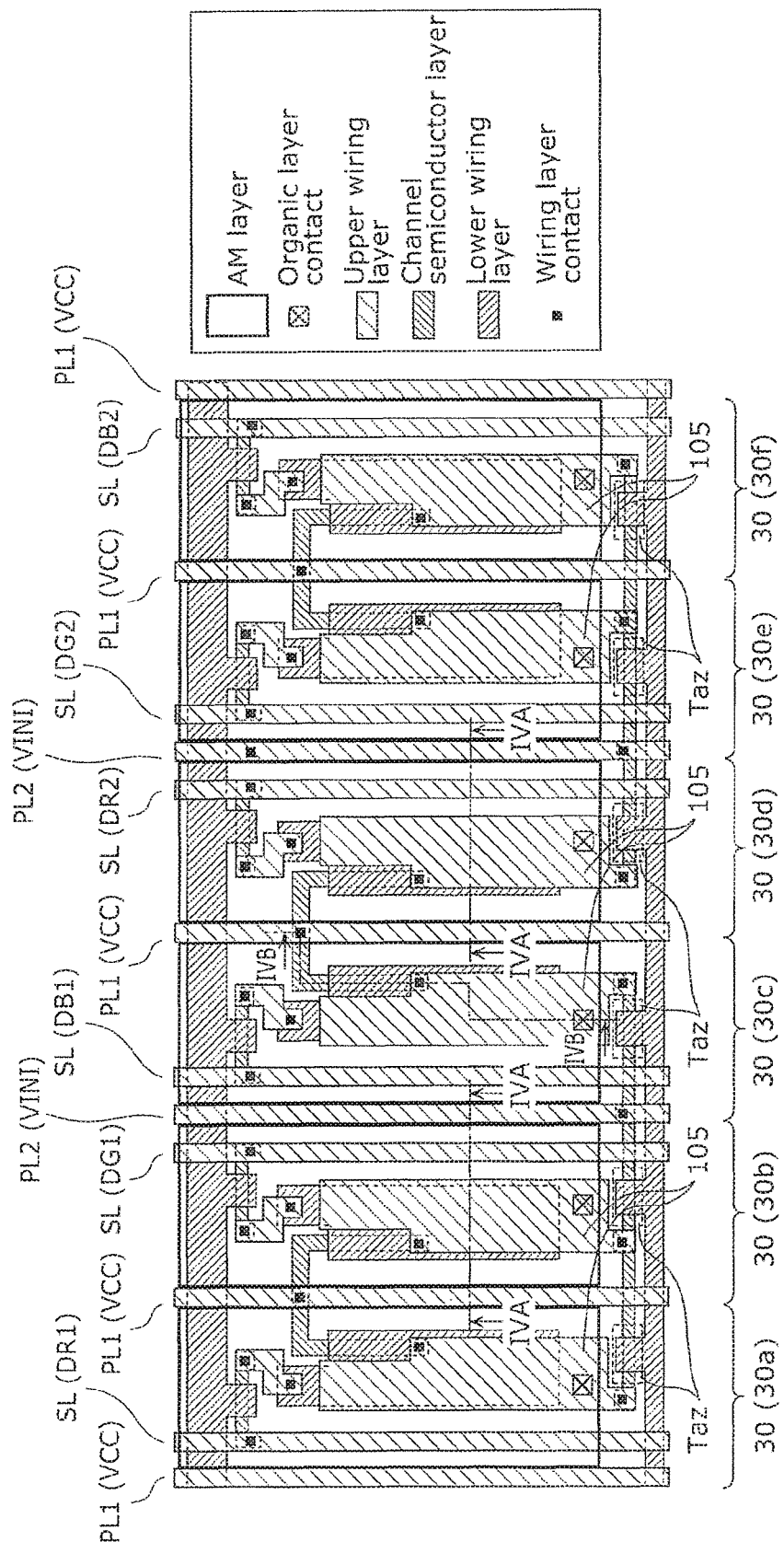
FIG. 3 is a top perspective view illustrating a wiring layout of a plurality of pixels according to Embodiment 1.
Figure 4A:
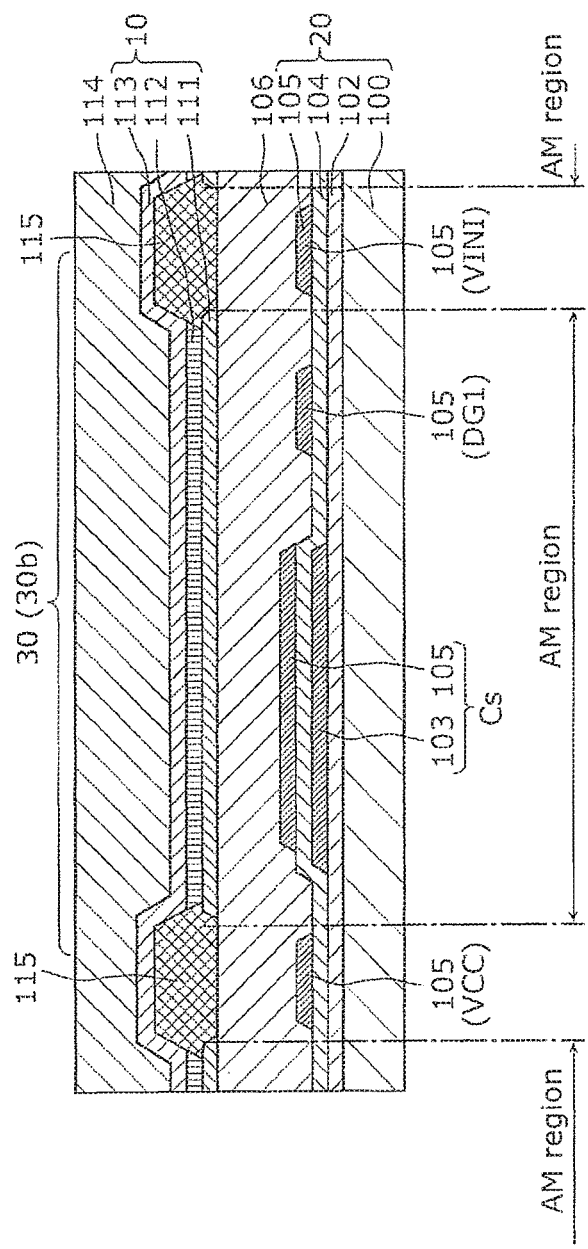
FIG. 4A is a cross-sectional view taken along line IVA-IVA in FIG. 3 and illustrates a configuration of a pixel according to Embodiment 1.

FIG. 3 is a top view illustrating a wiring layout of the pixels 30 in the display device 1 according to the present embodiment, and illustrates a configuration when viewed from the light emission side. FIGS. 4A and 4B are cross-sectional views illustrating a configuration of one pixel 30 according to the embodiment. More specifically, FIG. 3 is a top view of a lower wiring layer 103, a channel semiconductor layer 101, an upper wiring layer 105, and the AM layer 111 illustrated in FIGS. 4A and 4B. Note that FIG. 3 illustrates only the outside shape of the AM layer 111 and illustrates a perspective view of the inner side of the AM layer 111. FIG. 4A is a cross-sectional view taken along line IVA-IVA in FIG. 3, and FIG. 4B is a cross-sectional view taken along line IVB-IVB in FIG. 3. In these cross-sectional views, part of the widths of constituent elements may be reduced for purposes of simple illustration.

Figure 4B:
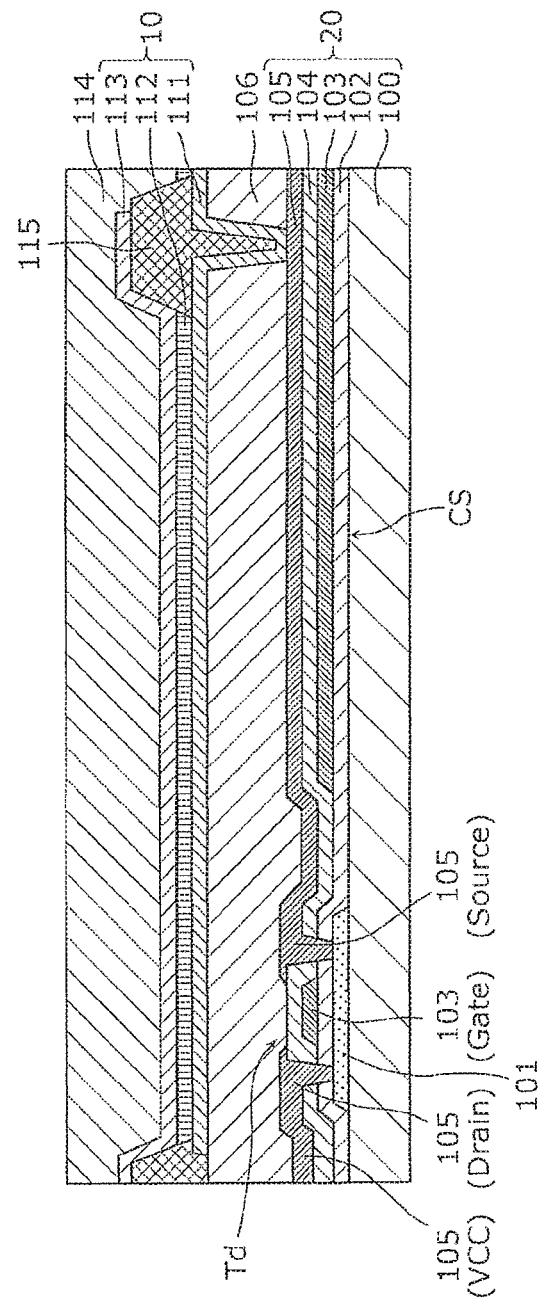
FIG. 4B is cross-sectional view taken along line IVB-IVB in FIG. 3 and illustrates the configuration of the pixel according to the embodiment.

As illustrated in FIGS. 3, 4A, and 4B, the display device 1 is a top-emission type display device in which the active matrix substrate 20 and the organic EL element 10 are stacked on top of each other from below in the stated order.

More specifically, the display device 1 according to the present embodiment has a stacked structure in which the channel semiconductor layer 101, a gate insulating layer 102, the lower wiring layer 103, a passivation layer 104, the upper wiring layer 105, a leveling layer 106, the AM layer 111, the organic EL layer 112, the transparent electrode layer 113, an encapsulating material layer 114, and a bank 115 are stacked on top of one another on a substrate 100 in the stated order from the substrate 100 side. The display device 1 further includes, for example, an opposed substrate bonded to the stacked structure and a protection film that protects the encapsulating material layer 114, but the description thereof will be omitted.

In the display device 1 configured as described above, the substrate 100, the channel semiconductor layer 101, the gate insulating layer 102, the lower wiring layer 103, the passivation layer 104, and the upper wiring layer 105 constitute the active matrix substrate 20. The AM layer 111, the organic EL layer 112, and the transparent electrode layer 113 constitute the organic EL element 10.

The substrate 100 may be a glass substrate. Alternatively, the substrate 100 may be a flexible substrate made of a resin.

The channel semiconductor layer 101 includes channels of each transistor (the driving transistor Td and the transistors Tws and Taz) as illustrated in FIGS. 3 and 4B. The channels are formed in island shapes by, for example, patterning a semiconductor film such as a silicon semiconductor film or an oxide semiconductor film.

The gate insulating layer 102 is a gate insulation film of each transistor and formed on the entire display area to cover the channel semiconductor layer 101 as illustrated in FIGS. 4A and 4B.

The lower wiring layer 103 is a wiring layer that constitutes the gate lines GL, the gate electrode (so-called gate metal; GM) of each transistor, and the first electrodes of the capacitive elements CS. The gate lines GL, the gate electrodes, and the first electrodes are formed in predetermined shapes by patterning the same metal film.

The passivation layer 104 is an interlayer insulating layer for insulating the lower wiring layer 103 and the upper wiring layer 105 as illustrated in FIGS. 4A and 4B.

The upper wiring layer 105 is a wiring layer that constitutes the power lines PL, the source lines SL, the source and drain electrodes (so-called source-drain (SD) metal) of each transistor, and the second electrodes of the capacitive elements CS. The power lines PL, the source lines SL, the source and drain electrodes of each transistor, and the second electrodes are formed in predetermined shapes by patterning the same metal film.

The leveling layer (Interlayer insulating layer) 106 is formed between the active matrix substrate 20 and the organic EL element 10 to secure, for example, flatness of the organic EL element 10 as illustrated in FIGS. 4A and 4B. The material for the leveling layer 106 may be a soft material with low viscosity, such as an acrylic material.

The AM layer 111 is a metal electrode layer that constitutes the anodes of the organic EL elements 10. The AM layer 111 may be a reflective electrode layer having light reflecting properties and made of a metal having a high reflection coefficient. The AM layer 111 may be made of Al or Ag, may be made or an alloy of these metals.

The organic EL layer 112 is a light emitting part constituted by stacking, for example, a hole transfer layer, a light emitting layer, and an electron transfer layer on top of one another. The organic EL layer 112 is surrounded by the bank 115 as illustrated in FIG. 4A. In the present embodiment, the organic EL layer 112 is isolated by the bank 15 for each pixel 30.

The transparent electrode layer 113 is a layer that constitutes the cathode of the organic EL element 10. The transparent electrode layer 113 may be made of a transparent metal oxide such as an indium tin oxide (ITO) or an indium zinc oxide (IZO). In the present embodiment, the transparent electrode layer 113 is a common electrode that is commonly provided as the cathodes of the organic EL elements 10 in all of the pixels 30 as illustrated in FIGS. 4A and 4B.

The encapsulating material layer 114 is an insulating layer made of an insulating material, and is a protective layer for preventing entry of moisture or oxygen into the organic EL element 10.

The bank (dividing wall) 115 has openings for separating and partitioning the organic EL layer 112 for each sub-pixel as illustrated in FIG. 4A. The AM layer 111 and the organic EL layer 112 are formed in the openings of the bank 115.

In the present embodiment, the bank 115 is a pixel bank that separates and partitions the plurality of pixels 30 (sub-pixels) for each pixel 30. That is, the bank 115 is formed such that projections extending in the column direction of the pixels 30 intersect with projections extending in the row direction of the pixels 30. The organic EL layer 112 is formed in openings that are portions surrounded by these projections. Note that the bank 115 may be a line bank.

In the aforementioned wiring layout of the display area, as illustrated in FIG. 3, the first power lines PL1 for supplying the power supply voltage VCC are installed between the pixels 30a and 30b, between the pixels 30c and 30d, and between the pixels 30e and 30f and further installed on the left side of the pixel 30a and on the right side of the pixel 30f. In each pair of the pixels 30a to 30f that sandwich each first power line PL1 therebetween, the constituent elements of the pixel circuits, namely, the organic EL elements 10, the driving transistors Td, the capacitive elements CS, and the transistors Tws and Taz, are disposed axisymmetrically with respect to the first power line PL1. The above arrangement of the first power lines PL1 allows each of the pixels 30a to 30f to be directly supplied with the power supply voltage VCC from the closest first power line PL1.

The second power lines PL2 for supplying the initialization voltage VINI are installed between the pixels 30b and 30c and between the pixel 30d and pixel 30e. In each pair of the pixels 30b to 30e that sandwich each second power line PL2 therebetween, the constituent elements of the pixel circuits, namely, the organic EL elements 10, the driving transistors Td, the capacitive elements CS, and the transistors Tws and Taz, are disposed axisymmetrically with respect to the second power line PL2. The above arrangement of the second power lines PL2 allows each of the pixels 30b to 30e to be supplied with the initialization voltage VINI from the second power line PL2 to the second electrode (upper wiring layer 105) of the capacitive element CS via the transistor Taz.

On the other hand, each of the pixels 30a and 30f is supplied with the initialization voltage VINI from the second electrode (upper wiring layer 105) of the pixel 30b or 30e to the second electrode (upper wiring layer 105) of the capacitive element CS via the transistor Taz. That is, the pixels 30a and 30f among the pixels 30 are supplied with the initialization voltage VINI respectively from the pixels 30b and 30e, the pixel 30b being disposed between the pixel 30a and the second power lines PL2 closest in the pixel row direction to the pixel 30a, and the pixel 30e being disposed between the pixel 30f and the second power line PL2 closest in the pixel row direction to the pixel 30f.

As illustrated by the pixel layout illustrated in FIG. 3, the number of first power lines PL1 is greater than the number of second power lines PL2, and three first power lines PL1 and two second power lines PL2 are installed for the six pixels 30a to 30f. That is, the number of pixels 30 to which the power supply voltage VCC is supplied from a single first power line PL1 is two per row. On the other hand, the number of pixels 30 to which the initialization voltage VINI is directly or indirectly supplied from a single second power line PL2 is three per row. More specifically, the second power line PL2 on the left side in FIG. 3 is used to directly supply the initialization voltage VINI to the pixels 30b and 30c and indirectly supply the initialization voltage VINI to the pixel 30a. The second power line PL2 on the right side in FIG. 3 is used to directly supply the initialization voltage VINI to the pixels 30d and 30e and indirectly supply the initialization voltage VINI to the pixel 30f.

1-4. Advantageous Effects

The display device 1, which includes a plurality of pixels 30 arranged as described above, can improve display quality as compared with a display device having a display area in which the same numbers of first power lines PL1 and the second power lines PL2 are installed in the same direction. To facilitate understanding of this, a configuration of a display device according to a comparative example will be described below for reference purposes.

Figure 5:
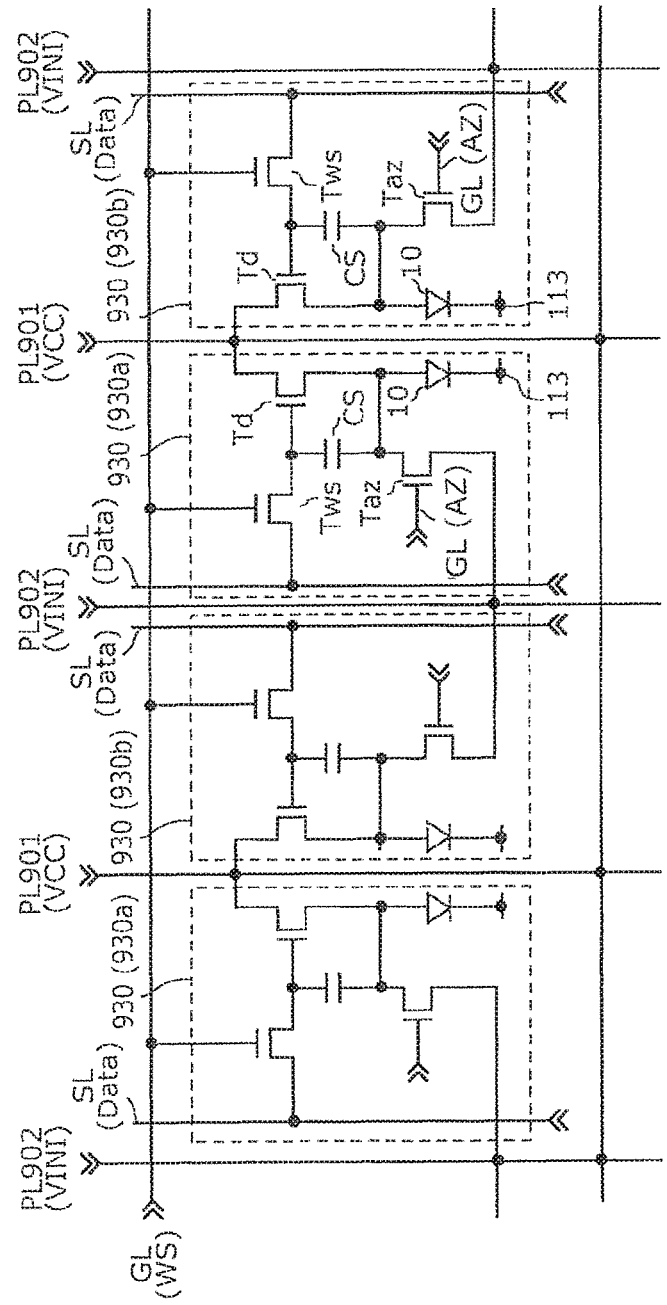
FIG. 5 illustrates an arrangement and circuit configuration of a plurality of pixels in a display device according to a comparative example.
Figure 6:
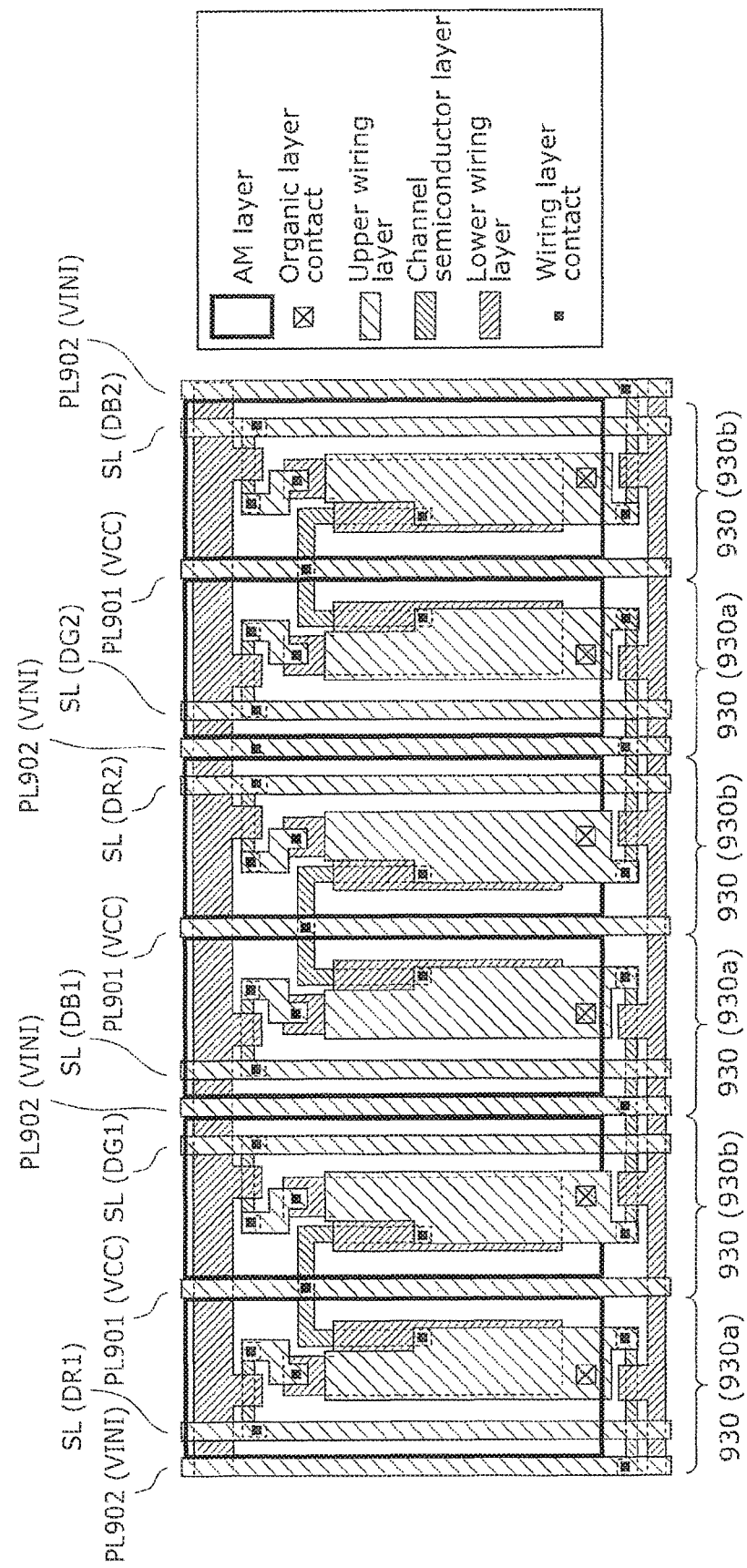
FIG. 6 is a top perspective view illustrating a wiring layout of the pixels in the display device according to the comparative example.

FIG. 5 illustrates an arrangement and circuit configuration of pixels 930 in a display device according to a comparative example. FIG. 6 is a top perspective view illustrating a wiring layout of the pixels 930 in the display device according to the comparative example.

Among the pixels 930 illustrated in FIGS. 5 and 6, a pixel 930a has the same circuit arrangement and configuration as those of the pixel 30c in the embodiment, and a pixel 930b has the same circuit arrangement and configuration as those of the pixel 30d in the embodiment. On the other hand, a wiring layout of first power lines PL901 and second power lines PL902 is different from that of the first power lines PL1 and the second power lines PL2 in the embodiment. More specifically, the first power lines PL901 and the second power lines PL902 according to the comparative example are alternately installed in the pixel row direction. That is, the number of first power lines PL901 is the same as the number of second power lines PL902 in the display area.

If, in an active matrix display device that installs a plurality of types of power lines in the display area, the number of first power lines PL901 is the same as the number of second power lines PL902 and the amount of power supplied from the first power lines PL901 to the pixels 930 is greater than the amount of power supplied from the second power lines PL902 to the pixels 930 as in the comparative example, the amount of voltage drop across a single first power line PL901 becomes greater than the amount of voltage drop across a single second power line PL902. For example, in the case of a 20-in. display panel, the amount of current flowing through the first power lines PL901 is of the order of 10 times the amount of current flowing through the second power lines PL902. In this case, for example, the maximum amount of voltage drop across the first power lines PL901 becomes greater than the maximum amount of voltage drop across the second power lines PL902, and accordingly, the amounts of voltage drop become unbalanced.

In contrast, the display device 1 according to the present embodiment installs different numbers of first power lines PL1 and second power lines PL2, which have different amounts of power supplied to the pixels 30. Thus, the amount of voltage drop across the first power lines PL1 and the amount of voltage drop across the second power lines PL2 can be balanced. More specifically, in the present embodiment, the amount of power supplied from a first power line PL1 to a single pixel is greater than the amount of power supplied from a second power line PL2 to a single pixel. In view of this, the number of pixels 30 to which the power supply voltage VCC is supplied from a single first power line PL1 is reduced to less than the number of pixels 30 to which the power supply voltage VCC is supplied from a single second power line PL2 by increasing the number of first power lines PL1 to more than the number of second power lines PL2. This configuration reduces a difference between the maximum amount of voltage drop across the first power lines PL1 and the maximum amount of voltage drop across the second power lines PL2, thus reducing the unbalanced amounts of voltage drop. That is, the amounts of voltage drop can be equalized without making considerable changes to the layout of the pixel circuit (without decreasing the efficiency of layout of the pixel circuit).

Moreover, one (e.g., 30b and 30e) of the pixels 30 may be sandwiched between another one (e.g., 30a and 30f) of the pixels 30 and the second power line PL2 that is closest in the pixel row direction to the other one of the pixels 30, and the other one (e.g., 30a and 30f) of the pixels 30 may be supplied with the initialization voltage VINI from the one (e.g., 30b and 30e) of the pixels 30.

In this case, the other one (30a and 30f) of the pixels 30 can be supplied with the initialization voltage VINI from the one (30b and 30e) of the pixels 30, not from the second power line PL2, without installing any extension line that connects a distance between the other one of the pixels 30 and the second power line PL2. Accordingly, the amounts of voltage drop can be equalized without installing any additional extension line (without decreasing the efficiency of layout) while maintaining the configuration in which the number of second power lines PL2 is less than the number of first power lines PL1.

Each of the pixels 30 may include the organic EL element 10 for emitting light in accordance with current and the driving transistor Td for driving current flowing through the organic EL element 10, and the first power lines PL1 may be used to pass the current through the organic EL element 10 by supplying the power supply voltage VCC to the driving transistor Td. In this case, each of the pixels 30 includes a current-driven light emitting element, and the amount of voltage drop across the first power lines PL1 becomes greater than the amount of voltage drop across the second power lines PL2. In contrast, the number of first power lines PL1 is greater than the number of second power lines PL2. Thus, the amount of voltage drop across the first power lines PL1 can be suppressed as compared with the case of the comparative example in which the number of first power lines PL901 is the same as the number of second power lines PL902. Accordingly, the amount of voltage drop across the first power lines PL1 and the amount of voltage drop across the second power lines PL2 can be balanced.

In two pixels (e.g., 30a and 30b, 30c and 30d, or 30e and 30f) that share a first power line PL1 among the pixels 30, the circuit elements including the organic EL elements 10 and the driving transistors Td may be disposed axisymmetrically with respect to the first power line PL1. In this case, the two pixels, which are arranged axisymmetrically with respect to the first power line PL1, can have the same form of connection with the first power line PL1. Accordingly, the amounts of voltage drop of the power supply voltage VCC supplied to the above two pixels can be equalized, and therefore, the amounts of voltage drop across the first power lines PL1 can be equalized.

The display device 1 further includes the source lines SL that are each installed for each pixel column or each pixel row and through which a light emission voltage for causing the organic EL elements 10 to emit light is supplied to the pixels 30. Each pixel 30 further includes the capacitive element CS that includes the first electrode connected to the gate of the driving transistor Td and the second electrode connected to the anode of the organic EL element 10, the transistor Tws that switches between continuity and discontinuity between the source line SL and the first electrode, and the transistor Taz that switches whether to apply the initialization voltage VINI to the junction between the other of the source and drain of the driving transistor Td and the anode of the organic EL element 10. In the pixels 30, the power supply voltage VCC may be applied to one of the source and drain of the driving transistor Td. The pixels 30a and 30f may respectively sandwich the pixels 30b and 30e between themselves and the second power lines PL2 that are closest in the pixel row direction to the pixels 30a and 30f, and the second electrodes of the pixels 30a and 30f may be connected respectively to the second electrodes of the pixels 30b and 30e via the transistors Taz.

In this case, each pixel 30 has a so-called 3Tr1C circuit configuration constituted by the driving transistor Td, the organic EL element 10, the capacitive element CS, and the transistors Tws and Taz. At this time, since the number of first power lines PL1, which are power lines for supplying current to the organic EL elements 10, is greater than the number of second power lines PL2, the amount of voltage drop across the first power lines PL1 and the amount of voltage drop across the second power lines PL2 can be balanced by reducing the number of second power lines PL2, through which a smaller amount of power is supplied. Accordingly, the amounts of voltage drop can be equalized without decreasing the efficiency of layout of the aforementioned 3Tr1C.

Embodiment 2

A display device according to the present embodiment is the same as the display device 1 according to Embodiment 1 in the arrangement of the two power lines (first power lines PL1 and second power lines PL2), which have different power sources in the display area, but is different in the circuit configuration of each pixel. The following description focuses on differences between the display device according to Embodiment 2 and the display device 1 according to Embodiment 1, and a description of identical parts will be omitted.

2-1. Overall Configuration

An overall configuration of the display device according to the present embodiment is similar to that of the display device 1 according to Embodiment 1. The display device according to the present embodiment is an active matrix display device that includes an organic EL element (light emitting element) 10 and an active matrix substrate 20 and in which a plurality of pixels 40 are arranged in a matrix.

The active matrix substrate 20 is a substrate that includes a plurality of gate lines GL extending in the row direction of the pixels 40, a plurality of source lines SL (data lines) extending in the column direction of the pixels 40, and a plurality of power lines PL extending the column direction of the pixels 40. The active matrix substrate 20 is, for example, a thin-film semiconductor array device for display devices. The source lines SL and the gate lines GL are installed orthogonal to each other.

Each pixel 40 is partitioned by gate lines GL and source lines SL that are orthogonal to each other. Each pixel 40 includes a drive circuit that drives the organic EL element 10 corresponding to the pixel 40. In the present embodiment, each pixel 40 is a sub-pixel that corresponds to one of the three primary colors R, G, and B, and three pixels 40 including a pixel 40 corresponding to blue (B), a pixel 40 corresponding to red (R), and a pixel 40 corresponding to green (G) constitute one pixel 40G. Note that pixels 40 of the same color are arranged adjacent to one another in the column direction.

Each of the gate lines GL is provided for each pixel row constituted by a plurality of pixels 40 in the same row. Each of the source lines SL is provided for each pixel column constituted by a plurality of pixels 40 in the same column.

The power lines PL extend in the pixel column direction (first direction) and, as will be described later, includes first power lines through which a first power supply voltage is supplied to the pixels 40, and second power lines through which a second power supply voltage is supplied to the pixels 40.

2-2. Circuit Configuration of Pixel

Figure 7:
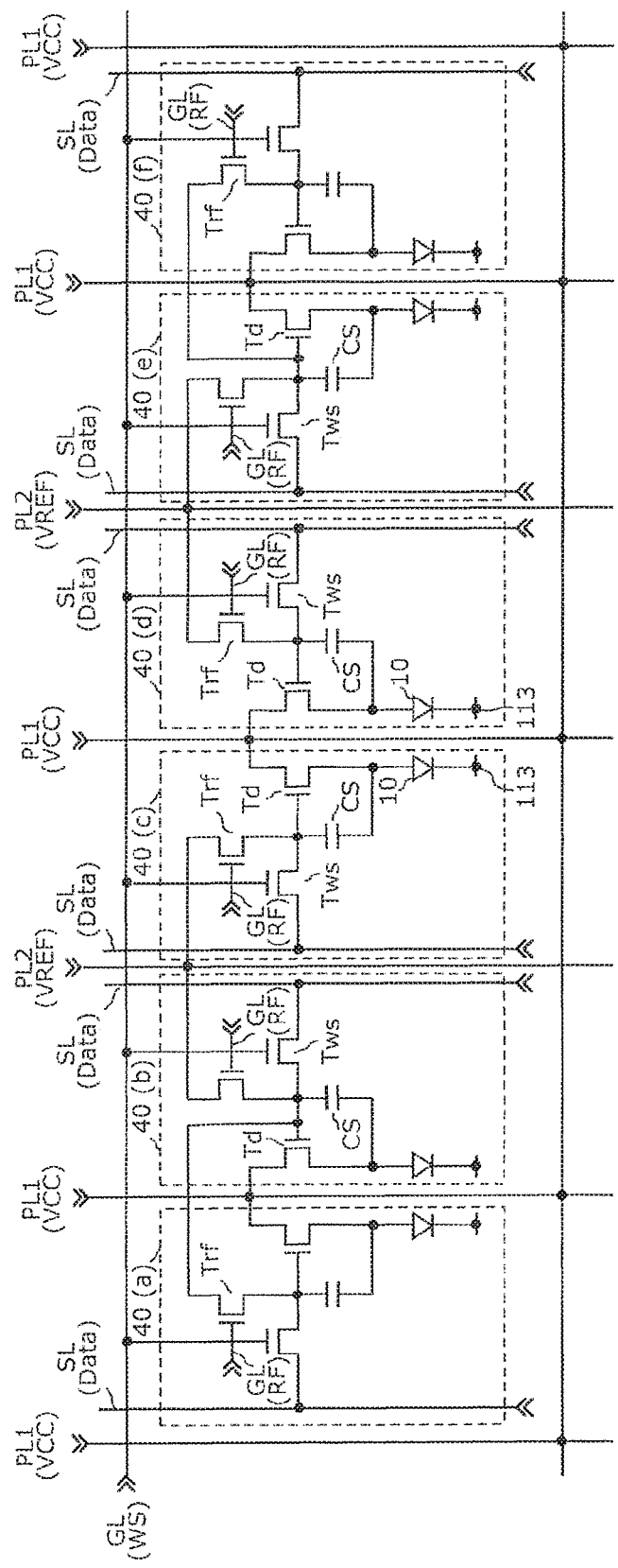
FIG. 7 illustrates an arrangement and circuit configuration of a plurality of pixels according to Embodiment 2.

Next, a circuit configuration of each pixel 40 will be described. FIG. 7 illustrates an arrangement and circuit configuration of a plurality of pixels 40 according to Embodiment 2. More specifically, FIG. 7 illustrates six pixels 40 arranged adjacent to one another in the row direction, as part of the display area.

As illustrated in FIG. 7, each pixel 40 in the display device according to the present embodiment includes a driving transistor Td, transistors Tws and Trf, a capacitive element CS, and an organic EL element 10. Each pixel 40 is connected to a gate line GL, a source line SL, and a power line PL.

The transistor Trf is a switching transistor (second transistor) for applying a reference voltage VREF to the first electrode of the capacitive element CS. Here, the connection structure of the transistor Trf differs between the pixels 40b, 40c, 40d, and 40e and the pixels 40a and 40f.

The transistors Trf of the pixels 40b to 40e switch between continuity and discontinuity between the second power lines PL2 through which the second power supply voltage (reference voltage VREF) is supplied and the first electrodes of the capacitive elements CS in accordance with RF signals supplied through the gate lines GL. That is, the transistors Trf of the pixels 40b to 40e each have one of the source and the drain connected to the second power line PL2, and the other of the source and drain connected to the first electrode of the capacitive element CS.

On the other hand, the transistor Trf of the pixel 40a switches between continuity and discontinuity between the first electrode of the pixel 40a and the first electrode of the pixel 40b in accordance with the RF signal supplied through the gate line GL. That is, the transistor Trf of the pixel 40a has one of the source and drain connected to the first electrode of the pixel 40a, and the other of the source and drain connected to the first electrode of the pixel 40b. The transistor Trf of the pixel 40f switches between continuity and discontinuity between the first electrode of the pixel 40f and the first electrode of the pixel 40e in accordance with the RF signal supplied through the gate line GL. That is, the transistor Trf of the pixel 40f has one of the source and drain connected to the first electrode of the pixel 40f, and the other of the source and drain connected to the first electrode of the pixel 40e.

In the present embodiment, the driving transistors Td and the transistors Tws and Trf are n-channel type TFTs.

The gate lines GL are used to supply timing signals (gate voltages) such as the WS signal and the RF signal to the pixels 40. In the present embodiment, the timing signals are supplied to each pixel 40 included in the same pixel row.

The source lines SL are data lines that are used to supply a light emission voltage to the pixels 40. In the present embodiment, a data voltage Vdata corresponding to gradation is supplied to each pixel 40 included in the same pixel column.

The first power lines PL1 are power lines extending in the pixel column direction (first direction) and used to supply the first power supply voltage (power supply voltage VCC) to the pixels 40a to 40f. The second power lines PL2 are power lines extending in the pixel column direction (first direction) and used to supply the second power supply voltage (reference voltage REF) different from the first power supply voltage to the pixels 40b, 40c, 40d, and 40e. In the present embodiment, all of the pixels 40 arranged in the display area are supplied with the power supply voltage VCC from the first power lines PL1. Pixels that belong to the pixel columns including the pixels 40b to 40e are supplied with the reference voltage VREF from the second power lines PL2. On the other hand, pixels that belong to the pixel column including the pixel 40a are supplied with the reference voltage VREF from pixels that belong to the pixel column including the pixel 40b, and pixels that belong to the pixel column including the pixel 40f are supplied with the reference voltage VREF from pixels that belong to the pixel column including the pixel 40e.

In other words, the pixel 40a sandwiches the pixel 40b between itself and the second power line PL2 that is closest in the pixel row direction to the pixel 40a, and is supplied with the reference voltage VREF from the pixel 40b. The pixel 40f sandwiches the pixel 40e between itself and the second power line PL2 that is closest in the pixel row direction to the pixel 40f, and is supplied with the reference voltage VREF from the pixel 40e. That is, one of the pixels 40 is sandwiched between another one of the pixels 40 and the second power line PL2 that is closest to the other one of the pixels 40 in the pixel row direction orthogonal to the pixel column direction, and the other one of the pixels 40 is supplied with the reference voltage VREF from the one of the pixels 40.

In the pixels 40 configured as described above, when the transistor Trf turns on upon receipt of the RF signal, the reference voltage VREF is applied to the first electrode of the capacitive element CS, and an operation of detecting the threshold voltage Vth of the driving transistor Td is started. When the transistor Trf transitions from the ON state to the OFF state upon receipt of the RF signal, the operation of storing the threshold voltage Vth in the capacitive element CS is completed. Thereafter, when the transistor Tws turns on upon receipt of the WS signal and supplies the data voltage Vdata, the capacitive element CS holds a voltage (Vdata+Vth) obtained by compensating for the threshold voltage Vth. As a result, the driving transistor Td supplies a pixel current according to the data voltage Vdata, which does not depend on the threshold voltage Vth of the driving transistor Td, to the organic EL element 10. Accordingly, the organic EL element 10 can emit light at a luminance corresponding to the gradation indicated by the data voltage Vdata The aforementioned circuit configuration of each pixel 40 is a so-called 3Tr1C type circuit configuration constituted by the driving transistor Td, the organic EL element 10, the capacitive element CS, and the transistors Tws and Trf.

Here, the number of first power lines PL1 is greater than the number of second power lines PL2. In the present embodiment, three first power lines PL1 and two second power lines PL2 are installed for the six pixels 40a to 40f as illustrated in FIG. 7. In other words, the number of pixels 40 to which the power supply voltage VCC is supplied from a single first power line PL1 is less than the number of pixels 40 to which the reference voltage VREF is supplied from a single second power line PL2. In the present embodiment, the number of pixels 40 to which the power supply voltage VCC is supplied from a single first power line PL1 is two per row as illustrated in FIG. 7. On the other hand, the number of pixels 40 to which the reference voltage VREF is directly or indirectly supplied from a single second power line PL2 is three per row. More specifically, the second power line PL2 on the left side in FIG. 7 is used to directly supply the reference voltage VREF to the pixels 40b and 40c and indirectly supply the reference voltage VREF to the pixel 40a. The second power line PL2 on the right side in FIG. 7 is used to directly supply the reference voltage VREF to the pixels 40d and 40e and indirectly supply the reference voltage VREF to the pixel 40f.

In the display device according to the present embodiment, the amount of voltage drop across a single first power line PL1 and the amount of voltage drop across a single second power line PL2 can be balanced by differentiating between the number of first power lines PL1 and the number of second power lines PL2, the first power lines and the second power lines having different amounts of power supplied to the pixels 40. In the case of the present embodiment, the first power lines PL1 are power lines for supplying current flowing to the organic EL element 10, and the second power lines PL2 are power lines for applying the reference voltage VREF to the first electrodes of the capacitive elements CS. Thus, the amount of power supplied from the first power lines PL1 to the pixels 40 is greater than the amount of power supplied from the second power lines PL2 to the pixels 40. Accordingly, if the number of first power lines PL1 is greater than the number of second power lines PL2, an unbalanced amount of voltage drop per power line can be reduced without making considerable changes to the layout of the pixel circuit (without changing the arrangement of the aforementioned 3Tr1C). It is thus possible to equalize the amounts of voltage drop at each pixel 40 without decreasing the efficiency of layout of the pixel circuit.

According to the present embodiment, in two pixels (e.g. pixels 40c and 40d) that share one first power line PL1 among the pixels 40, the constituent elements of the pixel circuits, namely, the organic EL elements 10, the driving transistors Td, the capacitive elements CS, and the transistors Tws and Trf, are arranged axisymmetrically with respect to the first power line PL1. In this case, the two pixels. Which are arranged axisymmetrically with respect to the first power line PL1, can have the same form of connection with the first power line PL1. Accordingly, the amounts of voltage drop of the power supply voltage VCC supplied to the above two pixels can be equalized, and therefore, the amounts of voltage drop across the first power lines can be equalized.

Other Embodiments

While the above has been a description of Embodiments 1 and 2 of the active matrix display devices according to the present disclosure, the present disclosure is not intended to be limited to the embodiments described above. The present disclosure also includes other modifications obtained by applying various changes conceivable by a person skilled in the art to the embodiments described above without departing from the scope of the present disclosure, and various types of equipment that installs the active matrix display device according to the present disclosure.

For example, while Embodiments 1 and 2 take the example of the configuration in which the three first power lines PL1 and the two second power lines PL2 are installed for the six pixels arranged in the pixel row direction, the numbers of power lines are not limited to this example. The number of first power lines PL1 and the number of second power lines PL2 may be determined according to a difference in the amount of current flowing through the first power lines PL1 and the second power lines PL2. For example, a configuration is possible in which five first power lines PL1 are installed for each second power line PL2.

While Embodiments 1 and 2 take the example of the configuration in which all of the pixels are adjacent to one of the first power lines PL1, and each first power line PL1 is used to supply the power supply voltage VCC to pixels that belong to two pixel columns, the present disclosure is not limited to this example. For example, a configuration is also possible in which each first power line PL1 is used to supply the power supply voltage VCC to pixels that belong to three or more pixel columns.

While Embodiments 1 and 2 described above take the example of the configuration in which the first power lines PL1 and the second power lines PL2 are installed as a plurality of types of power lines in the display area, three or more types of power lines may be installed in the display area.

The above description illustrates that the pixels 30 and 40 have a so-called 3Tr1C configuration constituted by three transistors (driving transistor Td and transistors Tws and Taz) and one capacitive element CS, as a pixel circuit for driving a light emitting element (in the above-description, organic EL element 10). However, the configuration of the pixel circuit is not limited to this example and, for example, the pixel circuit may include other transistors, other capacitive elements, and other circuit elements different from those described above.

While the transistors (driving transistor Td and transistors Tws, Taz, and Trf) in the above description are assumed to be n-channel type TFTs, those transistors may be p-channel type TFTs. Alternatively, some of the transistors may be n-channel type TFTs, and the others of the transistors may be p-channel type TFTs.

Each transistor is not limited to a top-gate type TFT and may be a bottom-gate type TFT. Moreover, each transistor is not limited to a TFT and may, for example, be a bipolar transistor that can achieve similar functions described above.

The light emitting element is not limited to an organic EL element that emits light in accordance with current, and may be an inorganic EL element that uses an inorganic compound to emit light in accordance with voltage. As another alternative, the light emitting element may have a cathode configured by a metal electrode layer, and an anode configured by a transparent electrode layer.

Figure 8:
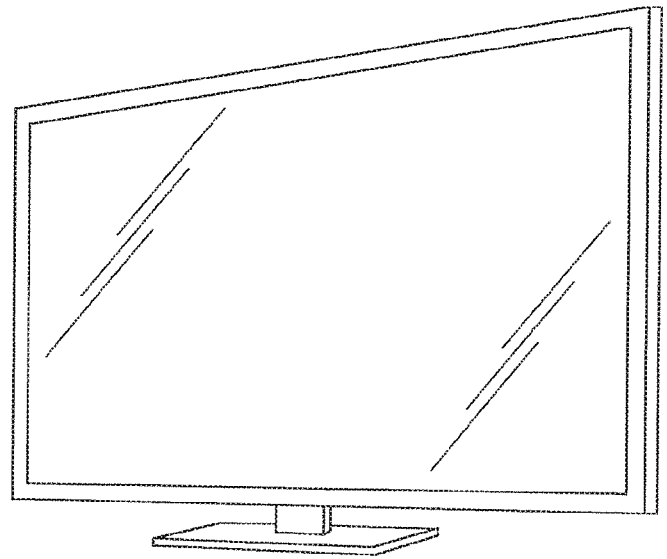
FIG. 8 is an external view of the active matrix display device.

The active matrix display device according to the present disclosure is well adapted to, for example, a flat panel display device as illustrated in FIG. 8. FIG. 8 is an external view of a flat panel display device. By using the active matrix display device according to the present disclosure, the flat panel display device can display, for example, images with high display quality.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is in particular useful for organic EL flat panel displays that incorporate a display device using an organic EL element, and is well adapted for use as a display device of compact high-precision displays that require uniformity of image quality.

The invention claimed is:

1. An active matrix display device comprising:
a plurality of pixels arranged in rows and columns;
a plurality of first power lines that extend in a first direction and through which a first power supply voltage is supplied to the plurality of pixels, the first direction being either a pixel row direction or a pixel column direction; and
a plurality of second power lines that extend in the first direction and through which a second power supply voltage different from the first power supply voltage is supplied to the plurality of pixels,
wherein a number of the plurality of first power lines is greater than a number of the plurality of second power lines,
wherein each of the plurality of first power lines is spaced from one another,
wherein at least one of the plurality of first power lines is adjacent to both another first power line and a second power line,
wherein one of the first power line among the plurality of first power lines is provided directly adjacent to two second power lines,
wherein a total number of pixels directly connected to the plurality of first power lines is greater than a total number of pixels directly connected to the plurality of second power lines, and
wherein an amount of power supplied from the plurality of first power lines to the plurality of pixels is greater than an amount of power supplied from the plurality of second power lines to the plurality of pixels.

2. The active matrix display device according to claim 1, wherein, among the plurality of pixels, a number of pixels that are supplied with the first power supply voltage from one of the plurality of first power lines is less than a number of pixels that are supplied with the second power supply voltage from one of the plurality of second power lines.

3. The active matrix display device according to claim 1, wherein one of the plurality of pixels is sandwiched between another one of the plurality of pixels and a second power line that is closest in a second direction to the other one of the plurality of pixels among the plurality of second power lines, the second direction being orthogonal to the first direction, and
the other one of the plurality of pixels is supplied with the second power supply voltage from the one of the plurality of pixels.

4. The active matrix display device according to claim 1, wherein each of the plurality of pixels includes:
a light emitter that emits light according to current flowing through the light emitter; and
a driver circuit that drives the current flowing through the light emitter, and
each of the plurality of first power lines is used to supply the first power supply voltage to the driver circuit of a corresponding one of the plurality of pixels to pass the current through the light emitter of the corresponding one of the plurality of pixels.

5. The active matrix display device according to claim 4, wherein, in each of two pixels that share one of the plurality of first power lines among the plurality of pixels, the light emitter and the driver circuit are disposed axisymmetrically with respect to the one of the plurality of first power lines.

6. The active matrix display device according to claim 4, further comprising
a plurality of data lines that are each installed for each pixel column or each pixel row and through which a light emission voltage for causing light emitters to emit light is supplied to the plurality of pixels,
wherein driver circuits are each a driving transistor that includes a first terminal, a second terminal, and a control terminal,
the light emitters are each an organic electroluminescent (EL) emitter that includes a third terminal and a fourth terminal,
each of the plurality of pixels further includes:
a capacitive circuit having a first electrode connected to the control terminal, and a second electrode connected to the third terminal;
a first transistor that switches between continuity and discontinuity between one of the plurality of data lines and the first electrode; and
a second transistor that switches to apply or not apply the second power supply voltage to the second electrode,
in each of the plurality of pixels, the first power supply voltage is applied to the first terminal,
one of the plurality of pixels is sandwiched between another one of the plurality of pixels and a second power line that is closest in a second direction to the other one of the plurality of pixels among the plurality of second power lines, the second direction being orthogonal to the first direction, and
the second electrode of the other one of the plurality of pixels is connected to the second electrode of the one of the plurality of pixels via the second transistor of the other one of the plurality of pixels.

7. The active matrix display device according to claim 4, further comprising a plurality of data lines that are each installed for each pixel column or each pixel row and through which a light emission voltage for causing light emitters to emit light is supplied to the plurality of pixels, wherein driver circuits are each a driving transistor that includes a first terminal, a second terminal, and a control terminal, the light emitters are each an organic electroluminescent (EL) emitter that includes a third terminal and a fourth terminal, each of the plurality of pixels further includes:

a capacitive circuit having a first electrode connected to the control terminal, and a second electrode connected to the second terminal;

a first transistor that switches between continuity and discontinuity between one of the plurality of data lines and the first electrode; and a second transistor that switches to apply or not apply the second power supply voltage to the first electrode, in each of the plurality of pixels, the first power supply voltage is applied to the first terminal, one of the plurality of pixels is sandwiched between another one of the plurality of pixels and a second power line that is closest in a second direction to the other one of the plurality of pixels among the plurality of second power lines, the second direction being orthogonal to the first direction, and the first electrode of the other one of the plurality of pixels is connected to the first electrode of the one of the plurality of pixels via the second transistor of the other one of the plurality of pixels.

8. The active matrix display device according to claim 1, wherein, among the plurality of pixels, a number of pixels that are supplied with the first power supply voltage from a single first power line from the plurality of first power lines is less than a number of pixels that are supplied with the second power supply voltage from a single second power line from the plurality of second power lines.

* * * * *